(12) United States Patent
Hirabayashi

(10) Patent No.: US 7,284,998 B2
(45) Date of Patent: Oct. 23, 2007

(54) ROBOT CONTROL DEVICE AND ROBOT SYSTEM

(75) Inventor: Tomokazu Hirabayashi, Hara (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/605,494

(22) Filed: Nov. 28, 2006

(65) Prior Publication Data

US 2007/0123081 A1 May 31, 2007

(30) Foreign Application Priority Data

Nov. 29, 2005 (JP) ............................ 2005-344656
Jun. 23, 2006 (JP) ............................ 2006-173760

(51) Int. Cl.
*H01R 3/00* (2006.01)

(52) U.S. Cl. .................................... 439/164

(58) Field of Classification Search ............... 439/164, 439/502, 632, 260
See application file for complete search history.

(56) References Cited

U.S. PATENT DOCUMENTS

| 5,605,432 | A | * | 2/1997 | Fink et al. ............... 414/752.1 |
|---|---|---|---|---|
| 6,364,079 | B1 | * | 4/2002 | Hiura ........................ 191/12.4 |
| 6,462,290 | B1 | * | 10/2002 | Matsumoto ............... 200/61.54 |
| 6,583,373 | B2 | * | 6/2003 | Ketzer et al. ............. 200/61.54 |
| 6,624,366 | B2 | * | 9/2003 | Uchiyama et al. ........ 200/61.54 |
| 6,979,200 | B2 | * | 12/2005 | Ritchie ........................ 439/15 |

FOREIGN PATENT DOCUMENTS

| DE | 29606194 | 6/1996 |
|---|---|---|
| DE | 29716575 | 11/1997 |
| EP | 0482243 | 4/1992 |
| JP | 2000-066706 | 3/2000 |
| JP | 2001-067110 | 3/2001 |

* cited by examiner

*Primary Examiner*—J. F. Duverne
(74) *Attorney, Agent, or Firm*—Harness, Dickey & Pierce, P.L.C.

(57) ABSTRACT

A robot control device is connected to an industrial robot through a connection cable. The robot control device has a casing that accommodates an actuator controller. A side surface of the casing has a stepped portion. The stepped portion includes a connecting portion located in such a manner that the connection cable extends along the side surface while arranged on the side surface. The connection cable is connected to the connecting portion. This configuration saves space of the robot control device.

6 Claims, 4 Drawing Sheets

ROBOT CONTROL DEVICE AND ROBOT SYSTEM

CROSS-REFERENCE TO RELATED APPLICATIONS

This application is based upon and claims the benefit of priority from prior Japanese Patent Application No. 2005-344656, filed on Nov. 29, 2005, and Japanese Patent Application No. 2006-173760, filed on Jun. 23, 2006, the entire contents of which are incorporated herein by reference.

BACKGROUND

The present invention relates to a robot control device and a robot system.

Typically, an industrial robot system includes a robot control device connected to an industrial robot through a power supply cable or a signal cable. As described in JP-A-2001-67110 and JP-A-2000-66706, the industrial robot receives a signal from the robot control device and operates in accordance with the signal.

To save space in a production facility, it is now desired that the size of the space occupied by the robot system be reduced. However, if the industrial robot, which may be a horizontally or vertically articulated type, includes an increased number of joints, a correspondingly increased number of actuators must be provided for the joints. This increases the diameter of a cable that connects each of the actuators to the robot control device.

As the diameter of the cable becomes greater, the bending radius of the cable becomes greater when the cable is routed and drawn from the robot control device in a desired direction. As a result, the cable projects out of the robot control system and occupies an enlarged space, increasing the area occupied by the robot system.

SUMMARY

Accordingly, it is an objective of the present invention to provide a robot control device and a robot system that save space.

According to one aspect of the invention, a robot control device that controls operation of an industrial robot is provided. The robot control device is connected to the industrial robot through a connection cable. An actuator is provided in the industrial robot. The robot control device includes an actuator controller that controls operation of the actuator. A casing accommodates the actuator controller. The casing has a side surface. A connecting portion is connected to the connection cable. A stepped portion is provided on the side surface in such a manner that the side surface of the casing has at least one of a projection and a recess. The connecting portion is arranged in the stepped portion in such a manner that the connection cable is located on the side surface while extending along the side surface.

According to another aspect of the invention, a robot system that includes an industrial robot having an actuator is provided. The robot system further includes a robot control device that controls operation of the industrial robot; and a connection cable that connects the industrial robot to the robot control device.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DESCRIPTION OF EXEMPLARY EMBODIMENTS

An embodiment of the present invention will now be described with reference to FIGS. 1 to 3.

Figure 1:
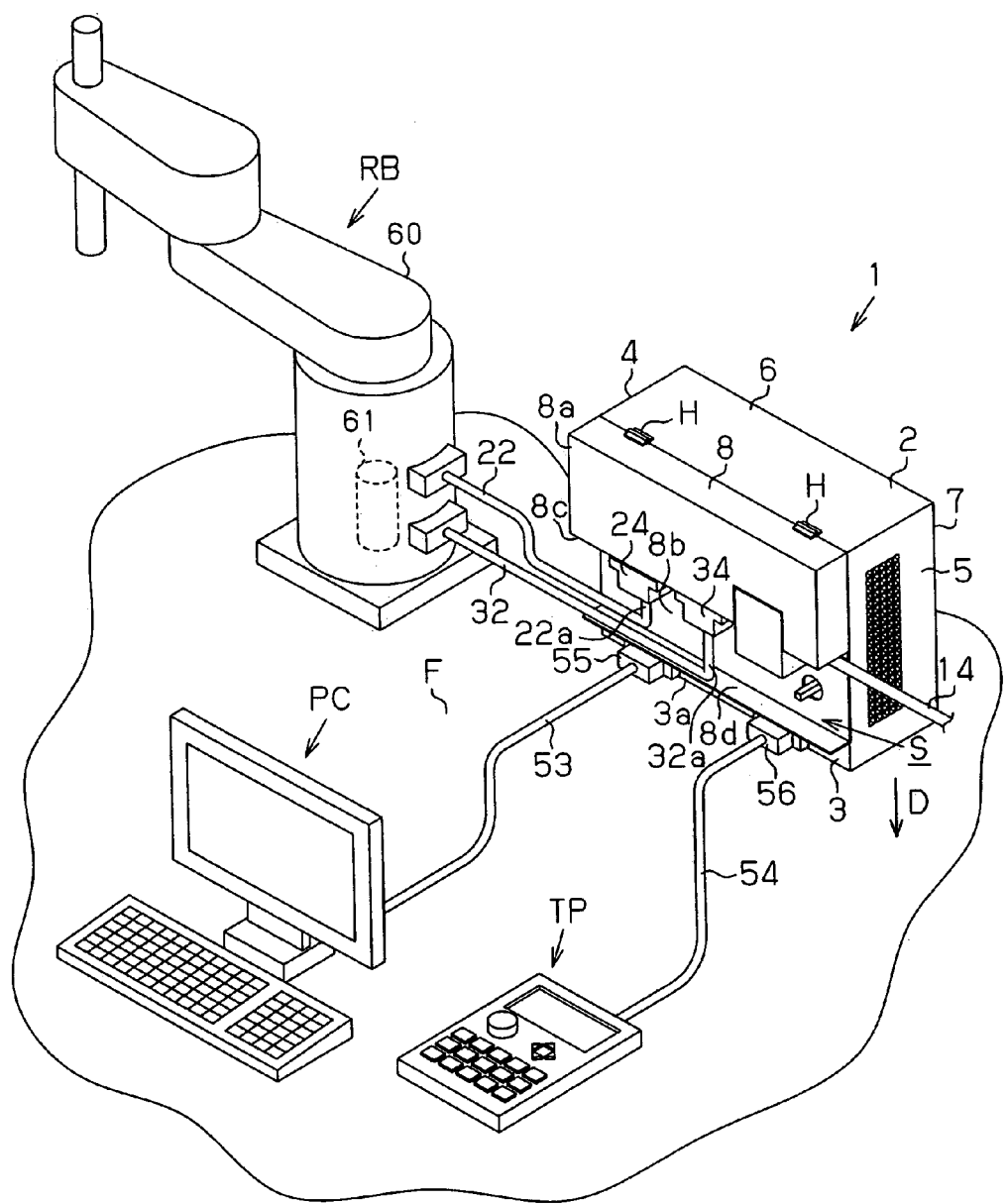
FIG. 1 is a perspective view showing a robot system according to an embodiment of the present invention.

As shown in FIG. 1, a robot system includes an industrial robot RB and a controller 1, or a robot control device that drives the industrial robot RB. The industrial robot RB has a four-axis control type horizontally articulated robot arm 60 and a motor 61, which is an actuator that actuates the robot arm 60.

The controller 1 includes a parallelepiped casing 2, which is placed on an installation surface F. The casing 2 has a base 3, a left plate 4, a right plate 5, and a top plate 6. The base 3 is arranged on the installation surface F. The left plate 4 extends from the left end of the base 3 and the right plate 5 extends from the right end of the base 3. The top plate 6 is mounted on the upper end of the left plate 4 and the upper end of the right plate 5. The casing 2 further has a back plate 7 and an open-close panel 8. The back plate 7 blocks the rear opening of the space defined by the base 3, the left plate 4, the right plate 5, and the top plate 6. The open-close panel 8 selectively opens and closes the front opening of this space.

The upper end of the open-close panel 8 is pivotally supported by the top plate 6 through a pair of left and right hinges H, or support members. The open-close panel 8 thus opens or closes the front opening of the casing 2 by pivoting about the hinges H, which is the fulcrum, with respect to the top plate 6. The open-close panel 8 is pivotal between a close position illustrated in FIG. 1 and an open position illustrated in FIG. 2.

The open-close panel 8 has a stepped portion. In other words, the open-close panel 8 includes a projection 8a projecting from an upper portion of the open-close panel 8 and a guide surface 8b formed in a lower portion of the open-close panel 8. The projection 8a projects forward with respect to the guide surface 8b. The projection 8a extends throughout the casing 2 in a lateral direction.

The bottom surface of the projection 8a forms a stepped surface 8c that extends perpendicular to the guide surface 8b. When the open-close panel 8 is held in a closed state, the stepped surface 8c extends parallel with the installation surface F. In this state, the normal direction D of the stepped surface 8c extends perpendicular to the installation surface F.

The guide surface 8b extends downward from the lower end of the projection 8a. The guide surface 8b extends throughout the casing 2 in the lateral direction. When the open-close panel 8 is closed, as illustrated in FIG. 1, the guide surface 8b extends perpendicular to the installation surface F. A cable guide piece 8d, which projects forward, is formed at the lower end of the guide surface 8b. The cable guide piece 8d extends throughout the guide surface 8b in the lateral direction.

The cable guide piece 8d, the guide surface 8b, and the stepped surface 8c define a routing space S. The routing space S is a recess located below the open-close panel 8. A power cable 22 and a signal cable 32 are routed in the routing space S.

Figure 2:
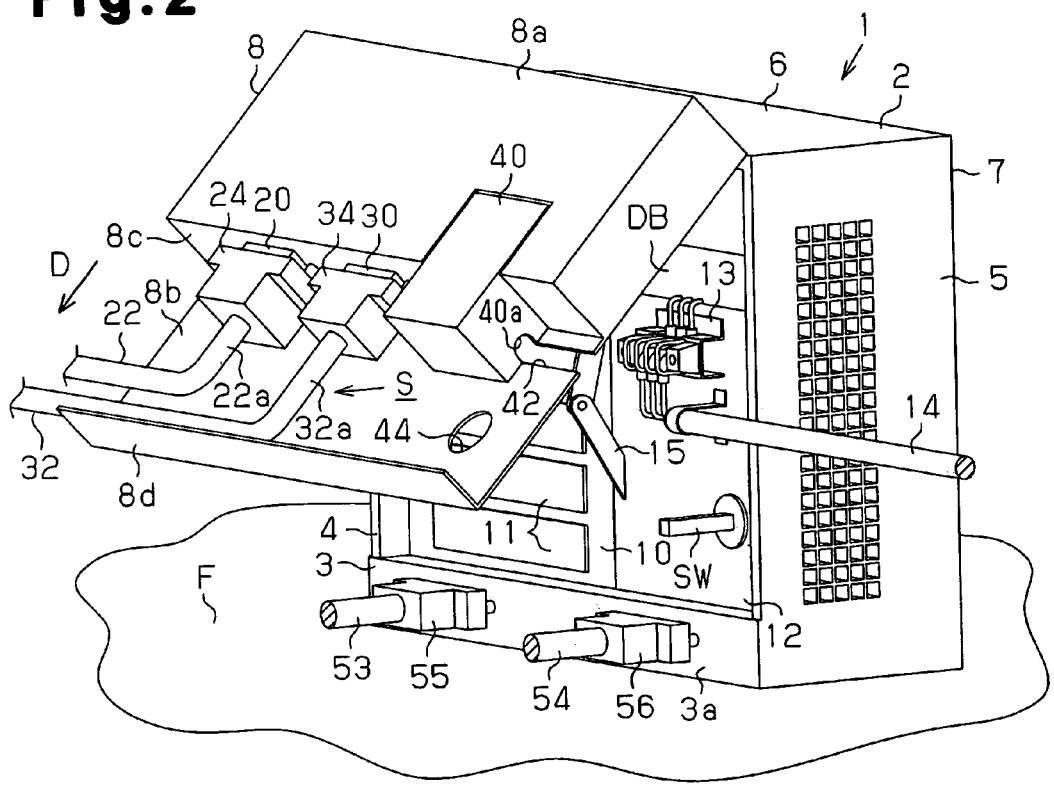
FIG. 2 is a perspective view showing a casing of a robot control device of FIG. 1.

As shown in FIG. 2, a rack 10 is provided in the casing 2. A plurality of motor drivers 11, which drive a motor 61, are removably received in the rack 10. The motor drivers 11 are vertically spaced at predetermined intervals. A drive board DB is arranged between the rack 10 and the back plate 7. By inserting the motor drivers 11 into the rack 10, the motor drivers 11 are electrically connected to the drive board DB. The drive board DB functions as an actuator control device that controls operation of the motor drivers With reference to FIG. 2, a terminal fixing plate 12 is provided at the right side of the rack 10 in the casing 2. An input terminal 13 is secured to the terminal fixing plate 12. A power supply cable 14 is connected to the input terminal 13. The power supply cable 14 supplies an output current of an external power source to the input terminal 13. A stopper 15 is arranged below the input terminal 13 and maintains the open-close panel 8 in an open state. The stopper 15 is capable of maintaining the angle of the open-close panel 8 with respect to the terminal fixing plate 12 at a predetermined value.

A first power connector 20 is secured to the stepped surface 8c of the open-close panel 8. A second power connector 24 is connected to the first power connector 20 from below. The power cable 22 extends from the second power connector 24 to the industrial robot RB and supplies power to the industrial robot RB. The first power connector 20 functions as a panel power connector and the second power connector 24 functions as a cable power connector. The first power connector 20 functions as a connecting portion that is arranged on the stepped surface 8c to connect the power cable 22 to the drive board DB.

Referring to FIG. 2, a first signal connector 30 is secured to the stepped surface 8c at the right side of the first power connector 20. A second signal connector 34 is connected to the first signal connector 30 from below. The signal cable 32 extends from the second signal connector 34 to the industrial robot RB and transmits a prescribed drive signal to the industrial robot RB. The first signal connector 30 functions as a panel signal connector and the second signal connector 34 functions as a cable signal connector. The first signal connector 30 functions as a connecting portion that is arranged on the stepped surface 8c to connect the signal cable 32 to the drive board DB.

As illustrated in FIG. 2, a cover case 40 that covers the input terminal 13 is arranged on the guide surface 8b at the right side of the first signal connector 30. The right wall of the cover case 40 has a recess 40a in which the power supply cable 14 is accommodated and a slit 42 extending from the recess 40a. When the open-close panel 8 is held in a closed state, the recess 40a is engaged with the power supply cable 14. When the open-close panel 8 opens or closes, the slit 42 allows the power supply cable 14 to pass through the open-close panel 8. Therefore, the power supply cable 14 is received in the routing space S without hampering opening or closing of the open-close panel 8.

Referring to FIG. 2, the terminal fixing plate 12 has a power supply switch SW that is manipulated to turn on or off the controller 1. The guide surface 8b has a through hole 44 through which the power supply switch SW is passed. The through hole 44 is located below the slit 42.

As shown in FIG. 1, a front surface 3a of the base 3 includes a first external connector 55 and a second external connector 56. A first external cable 53 is capable of connecting a personal computer PC to the first external connector 55. A second external cable 54 is capable of connecting a teaching pendant TP to the second external connector 56. The first and second external connectors 55, 56 are electrically connected to a non-illustrated CPU board of the controller 1. The personal computer PC and the teaching pendant TP provide information necessary for operation of the industrial robot RB to the CPU board.

With the first and second external cables 53, 54 separated from the controller 1, the controller 1 is capable of controlling operation of the industrial robot RB. That is, the first external cable 53, the second external cable 54, the first external connector 55, and the second external connector 56 are arranged outside the casing 2, thus saving the space occupied by the controller 1.

Figure 3:
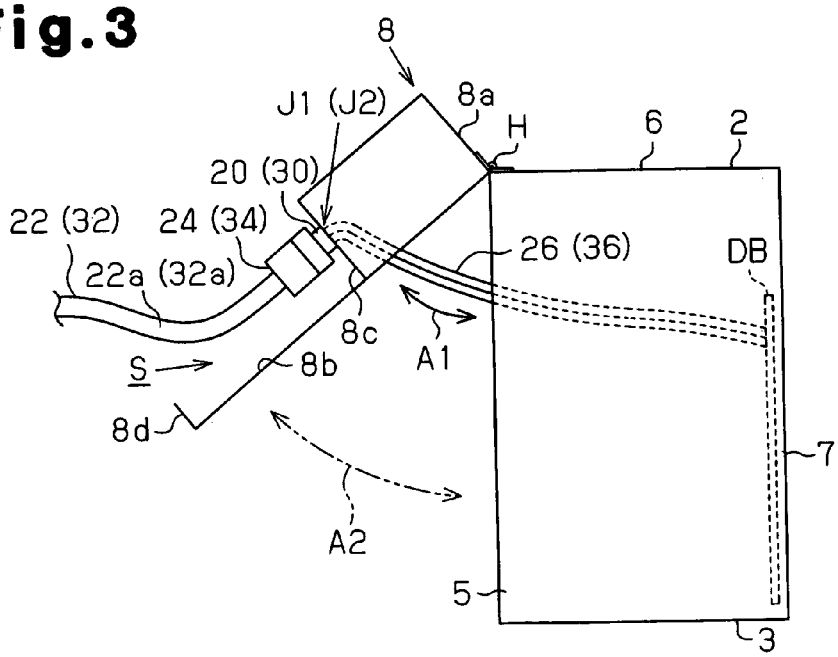
FIG. 3 is a side view for explaining operation of an open-close panel of FIG. 2.

As illustrated in FIG. 3, a first internal cable 26 and a second internal cable 36 are accommodated in the casing 2. The first internal cable 26 connects the first power connector 20 to the drive board DB. The length of the first internal cable 26 is selected in such a manner as to prevent interference with the open-close panel 8 when the open-close panel 8 opens or closes. This prevents a break of the first internal cable 26, a connection failure between the first internal cable 26 and the first power connector 20, and a connection failure between the first internal cable 26 and the drive board DB, regardless of repeated movement of the open-close panel 8.

Referring to FIG. 3, a first connecting portion J1 between the first power connector 20 and the first internal cable 26 is received in the interior of the projection 8a. In FIG. 3, first arrow A1 of a solid line represents a movement path of the projection 8a when the open-close panel 8 opens and closes. Second arrow A2 of a double-dotted chain line represents a movement path of the guide surface 8b when the open-close panel 8 opens or closes. The distance between each hinge H and the projection 8a is smaller than the distance between the hinge H and the guide surface 8b. In other words, the path represented by first arrow A1 is shorter than the path represented by second arrow A2. Accordingly, the first internal cable 26 of the illustrated embodiment, the first connecting portion J1 of which is received in the projection 8a, is shorter than the first internal cable 26 of a case in which, for example, the first connecting portion J1 is arranged on the guide surface 8b. As a result, the size of the casing 2 is reduced.

As illustrated in FIG. 3, the second internal cable 36 connects the first signal connector 30 to the drive board DB. The length of the second internal cable 36 is selected in such a manner as to prevent interference with the open-close panel 8 when the open-close panel 8 opens or closes. This prevents a break of the second internal cable 36, a connection failure between the second internal cable 36 and the first signal connector 30, and a connection failure between the second internal cable 36 and the drive board DB regardless of repeated movement of the open-close panel 8.

A second connecting portion J2 between the first signal connector 30 and the second internal cable 36 is arranged in the interior of the projection 8a. Accordingly, the length of the second internal cable 36 becomes shorter than the second internal cable 36 of a case in which, for example, the second connecting portion J2 is arranged on the guide surface 8b. As a result, the casing 2 has a smaller size.

As shown in FIG. 2, with the second power connector 24 connected to the first power connector 20, the power cable 22 extends from the second power connector 24 along the normal direction D of the stepped surface 8c. The power cable 22 is bent at a position spaced from the guide surface 8b in the routing space S, and is drawn in a desired direction. In the illustrated embodiment, the power cable 22 is drawn leftward as viewed in FIG. 2.

Therefore, the drawing direction of the power cable 22 from the controller 1 is determined simply by rotating or twisting the power cable 22 that extends along the normal direction D of the stepped surface 8c. For example, when the open-close panel 8 is closed, the power cable 22 that extends in the normal direction of the installation surface F is simply rotated or twisted. The power cable 22 is thus routed on the guide surface 8b and drawn from the controller 1. This allows the power cable 22 to be drawn from the controller 1 without projecting from the casing 2. Accordingly, even if the diameter of the power cable 22 increases, the power cable 22 is prevented from occupying a larger space. This saves space in the robot system.

Referring to FIG. 2, the signal cable 32 is bent in an L shape with the second signal connector 34 connected to the first signal connector 30. That is, the signal cable 32 extends from the second signal connector 34 to the guide piece 8d along the normal direction D of the stepped surface 8c, until the signal cable 32 contacts the guide piece 8d. The signal cable 32 is then bent on the guide piece 8d at 90 degrees with respect to the normal direction D and thus extends leftward along the guide piece 8d. In other words, the signal cable 32 is bent in the routing space S and then drawn in a desired direction, for example, leftward, while supported by the guide piece 8d.

Therefore, the drawing direction of the signal cable 32 from the controller 1 is determined simply by rotating or twisting the signal cable 32 that extends along the normal direction D of the stepped surface 8c. For example, when the open-close panel 8 is closed, the signal cable 32 that extends in the normal direction of the installation surface F is simply rotated or twisted so as to set the drawing direction of the signal cable 32 on the guide surface 8b of the controller 1. This allows the signal cable 32 to be drawn from the controller 1 without projecting from the casing 2. As a result, even if the diameter of the signal cable 32 increases, the signal cable 32 is prevented from occupying a larger space. This saves space in the robot system. As shown in FIGS. 1 and 2, the power cable 22 has a first vertical portion 22a, which extends vertically with respect to the stepped surface 8c. The signal cable 32 has a second vertical portion 32a, which extends vertically with respect to the stepped surface 8c. The first vertical portion 22a and the second vertical portion 32a thus extend vertically with respect to the installation surface F with the open-close panel 8 held in a closed state. The second vertical portion 32a extends to the guide piece 8d.

For repairing the controller 1 or performing a periodical maintenance work on the controller 1, the power source of the controller 1 is first turned off through manipulation of the power supply switch SW.

Subsequently, the open-close panel 8 is opened to check if the power cable 22 is properly connected to the first power connector 20 and the signal cable 32 is properly connected to the first signal connector 30.

The open-close panel 8 can be held in an open state by means of the stopper 15.

Next, after the open-close panel 8 is closed, the power cable 22 and the signal cable 32 are drawn from the controller 1 in the following manner. Specifically, in the routing space S, the power cable 22 and the signal cable 32 can be drawn in a desired direction by rotating or twisting the power cable 22 and the signal cable 32, which extend from the stepped surface 8c in the normal direction D of the stepped surface 8c, or the normal direction of the installation surface F.

The illustrated embodiment has the following advantages.

(1) The open-close panel 8 includes the stepped surface 8c to which the first power connector 20 and the first signal connector 30 are secured. The power cable 22 and the signal cable 32 extend in the normal direction D of the stepped surface 8c. Thus, for example, when the open-close panel 8 is closed, the power cable 22 and the signal cable 32 extend in the normal direction of the installation surface F.

The drawing direction of the power cable 22 and that of the signal cable 32 can thus be determined simply by rotating or twisting the power cable 22 and the signal cable 32 that extend from the stepped surface 8c in the normal direction D of the stepped surface 8c. Therefore, even if the power cable 22 and the signal cable 32 have an excessively large diameter and are poorly flexible, the power cable 22, the signal cable 32, the second power connector 24, and the second signal connector 34 are prevented from projecting from the casing 2. This suppresses enlargement of the space occupied by the controller 1, saving space in the robot system.

(2) Particularly, the depth, or the forward-rearward dimension, of the space occupied by the controller 1 is prevented from increasing. This adds to the flexibility of installing positions of the controller 1.

(3) The hinges H pivotally support the open-close panel 8. The open-close panel 8 can be opened or closed when the second power connector 24 are connected to the first power connector 20 and the second signal connector 34 are connected to the first signal connector 30. Maintenance of the interior of the controller 1 can thus be performed without removing the power cable 22 and the signal cable 32 from the controller 1. This shortens the time needed for such maintenance.

When the open-close panel 8 is open, the routing space S faces upward, or is visible to the maintenance worker. This makes it easy for the maintenance worker to visually check the connection state of the second power connector 24 with respect to the first power connector 20 and the connection state of the second signal connector 34 with respect to the first signal connector 30 at the front side of the controller 1. Further, the second power connector 24 and the second signal connector 34 are easily manually attached to and detached from the first power connector 20 and the first signal connector 30, respectively, in the routing space S. This facilitates repair of the power cable 22 and the signal cable 32 and prevents erroneous connection of the power cable 22 and that of the signal cable 32.

(4) As shown in FIGS. 1 and 2, all of the cables, or the power cable 22, the signal cable 32, the first external cable 53, the second external cable 54, and the power supply cable 14, are arranged on the front surface of the controller 1. This facilitates connection of the cables to the corresponding connectors and routing of the cables. The open-close panel 8 is the front surface of the casing 2, which is easily accessible, thus facilitating maintenance of the interior of the casing 2.

(5) As shown in FIG. 3, the first connecting portion J1 and the second connecting portion J2 are arranged in the interior of the projection 8a. Therefore, the distance between each of the hinges H, which defines the pivotal axis of the open-close panel 8, and the first connecting portion J1 is shorter than that of a case in which, for example, the first connecting portion J1 is arranged on the guide surface 8b. That is, the distance corresponding to first arrow A1 is shorter than the distance corresponding to second arrow A2. Similarly, the distance between each hinge H and the second connecting portion J2 is also shorter. This shortens the movement path of the first connecting portion J1 and that of the second connecting portion J2, thus reducing the length of the first internal cable 26 and that of the second internal cable 36. As a result, the size of the casing 2 is reduced.

(6) The stopper 15 maintains the open-close panel 8 in an open state if the open angle of the open-close panel 8 is greater than or equal to a predetermined value. This allows the maintenance worker to use both hands when performing maintenance work and thus facilitates such work. For example, in the case of a failure of the motor driver 11, replacement of the motor driver 11 can be carried out easily with both hands.

(7) The guide piece 8d is formed in the lower portion of the open-close panel 8. The guide piece 8d supports the signal cable 32 and draws the signal cable 32 in a desired direction. In the case illustrated in FIG. 1, the power cable 22 is drawn from the casing 2 in a state spaced from the guide piece 8d. The signal cable 32 is drawn from the casing 2 while guided by the guide piece 8d. This arrangement suppresses interference between the power cable 22 and the signal cable 32.

(8) The cover case 40 protects the input terminal 13. The cover case 40 covers the input terminal 13 when the open-close panel 8 is closed, or when the industrial robot RB is under control of the controller 1. This improves the safety of the controller 1.

The illustrated embodiment may be modified in the following forms.

Figure 4:
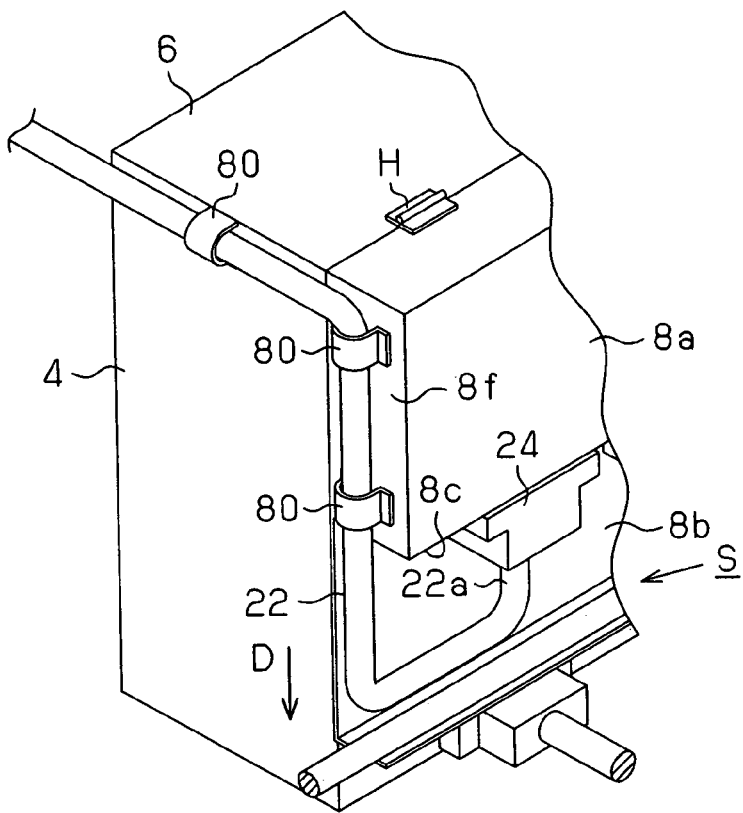
FIG. 4 is a perspective view showing routing of a cable on a stepped surface according to a modification of the invention.

Referring to FIG. 4, a plurality of cable fixing portions 80 may be provided on a left surface 8f of the open-close panel 8 and the left plate 4 of the casing 2. Each of the cable fixing portions 80 functions as a guide member that guides the power cable 22. In the case illustrated in FIG. 4, the multiple cable fixing portions 80 guide the power cable 22, which extends from the second power connector 24, upwardly to the vicinity of the upper end of the left surface 8f of the open-close panel 8. The cable fixing portions 80 then guide the power cable 22 in a manner bent rearward. Further, the power cable 22 is guided by the cable fixing portions 80 to pass the vicinity of the corresponding hinge H and extends rearward from the casing 2.

Without the cable fixing portions 80, the power cable 22 and the signal cable 32 must have a loose portion in the routing space S so as to allow opening and closing of the open-close panel 8. However, since the cable fixing portions 80 fix the power cable 22 and the signal cable 32 to the casing 2 and the open-close panel 8, the loose portion of the power cable 22 and that of the signal cable 32 become unnecessary. This further reliably prevents the power cable 22 and the signal cable 32 from projecting from the casing 2.

The positions of the projection 8a and the stepped surface 8c are not restricted to those on the open-close panel 8 of the casing 2. However, the projection 8a and the stepped surface 8c may be formed on the top plate 6 or the left plate 4 of the casing 2. Specifically, a stepped portion may be provided in the top plate 6 or the left plate 4. The first power connector 20 and the first signal connector 30 are arranged in the stepped portion. Also in this case, the power cable 22 and the signal cable 32 are routed along at least one side surface of the casing 2. This reduces the amount of projection of the cables, thus saving space in the robot system.

When the open-close panel 8 is held in a closed state, the stepped surface 8c does not necessarily have to be parallel with the installation surface F. The stepped surface 8c may be inclined with respect to the installation surface F as long as the stepped surface 8c projects from the guide surface 8b and guides the power cable 22 and the signal cable 32.

The projection 8a does not necessarily have to be formed in the upper portion of the open-close panel 8, and the stepped surface 8c does not necessarily have to correspond to the bottom surface of the projection 8a. Specifically, the projection 8a may be provided in a lower portion of the open-close panel 8 and the upper surface of the projection 8a may be the stepped surface 8c. In this case, the guide surface 8b on which the power cable 22 and the signal cable 32 are arranged is located in an upper portion of the open-close panel 8.

Figure 5:
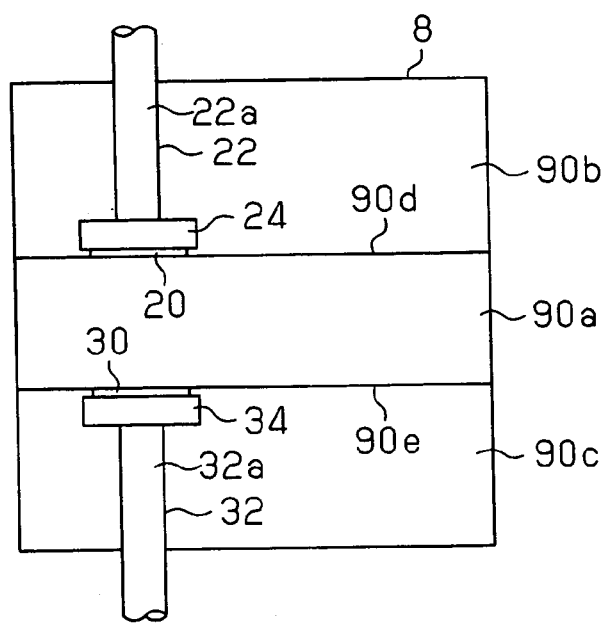
FIG. 5 is a front view showing arrangement of the cable with respect to the open-close panel according to another modification of the invention.

Referring to FIG. 5, a projection 90a may be provided in an intermediate portion of the open-close panel 8. The front surface of the open-close panel 8 includes a first guide surface 90b and a second guide surface 90c. The first guide surface 90b is located above the projection 90a and the second guide surface 90c is arranged below the projection 90a. The top surface of the projection 90a functions as a first stepped surface 90d and the bottom surface of the projection 90a functions as a second stepped surface 90e. For example, the power cable 22 is arranged on the first guide surface 90b while the signal cable 32 is provided on the second guide surface 90c.

In the case illustrated in FIG. 5, the total surface area of the first stepped surface 90d and the second stepped surface 90e is double the surface area of the single stepped surface 8c, which is illustrated in FIG. 1. This increases the number of the cables connected to the first stepped surface 90d and those connected to the second stepped surface 90e.

Figure 6:
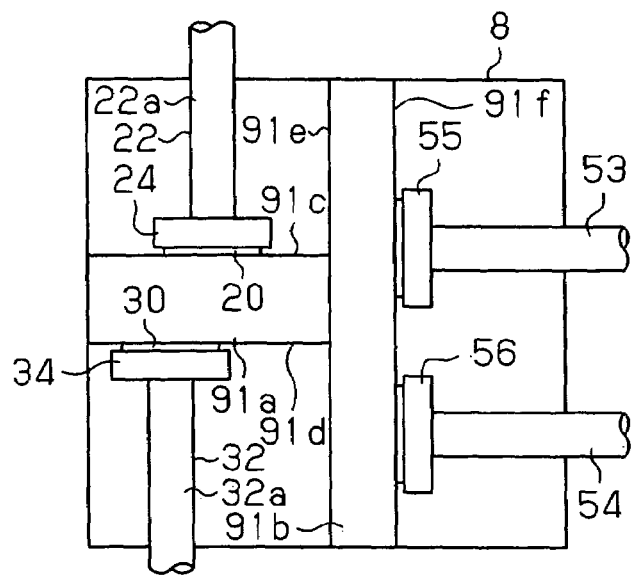
FIG. 6 is a front view showing arrangement of the cable with respect to the open-close panel according to another modification of the invention.

As illustrated in FIG. 6, a first projection 91a and a second projection 91b may be arranged in a T-shaped manner. Specifically, the second projection 91b is arranged on the front surface of the open-close panel 8 in such a manner that the second projection 91b extends vertically. The first projection 91a is arranged in such a manner that the first projection 91a extends leftward from an intermediate portion of the second projection 91b. The top surface of the first projection 91a functions as a first stepped surface 91c and the bottom surface of the first projection 91a functions as a second stepped surface 91d. The left surface of the second projection 91b functions as a third stepped surface 91e and the right surface of the second projection 91b functions as a fourth stepped surface 91f.

Referring to FIG. 6, for example, the power cable 22 is arranged above the first projection 91a and the signal cable 32 is provided below the first projection 91a. The first external cable 53 and the second external cable 54 are arranged at the right side of the second projection 91b. In this case, the open-close panel 8 has a first stepped surface 91c facing upward, a second stepped surface 91d facing downward, a third stepped surface 91e facing leftward, and a fourth stepped surface 91f facing rightward. This structure widens the selection range of the drawing directions of the cables.

Figure 7:
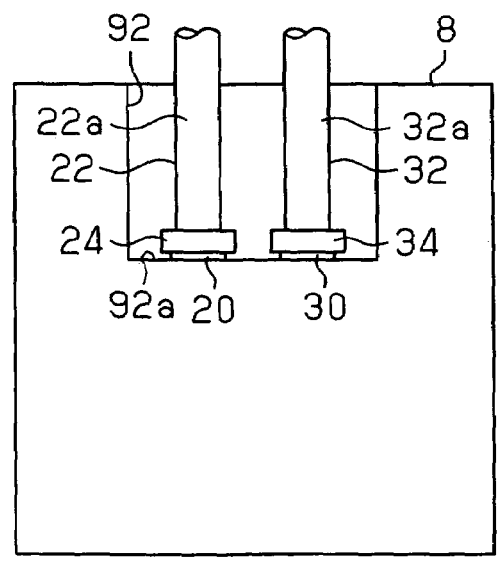
FIG. 7 is a front view for explaining arrangement of the cable with respect to the open-close panel according to another modification of the invention.

As illustrated in FIG. 7, a stepped surface 92a may be formed by defining a recess 92 in the front surface of the open-close panel 8. The recess 92 has an upper opening. For example, the bottom surface of the recess 92 corresponds to the stepped surface 92a. The power cable 22 and the signal cable 32 extend upward from the stepped surface 92a.

The open-close panel 8 may include the projection 8a, the projection 90a, the first projection 91a, the second projection 91b, and the recess 92 in combination.

The connecting portions are not restricted to the first power connector 20 and the first signal connector 30 but may be a terminal table. A connecting portion is arranged on the stepped surface 8c so as to connect the power cable 22 and the signal cable 32 to the drive board DB with the power cable 22 and the signal cable 32 extending along the front surface of the open-close panel 8. The terminal table is provided behind the projection 8a. The power cable 22 and the signal cable 32 pass the stepped surface 8c and extend from the industrial robot RB in the normal direction D of the stepped surface 8c. The power cable 22 and the signal cable 32 are thus connected to the terminal table.

In this case, the first power connector 20 and the second power connector 24 may be omitted and the power cable 22 may be connected directly to the first internal cable 26. Alternatively, the first signal connector 30 and the second signal connector 34 may be omitted. In this case, the signal cable 32 is connected directly to the second internal cable 36.

The front plate of the casing 2 is not restricted to the open-close panel 8 but may be a fixed attachment plate prohibited from opening and closing.

The orientation of the open-close panel 8 when the open-close panel 8 is attached to and detached from the casing 2 may be modified. For example, the open-close panel 8 may be oriented in a manner vertically reversed from that of the illustrated embodiment when attached to and detached from the casing 2. Further, the open-close panel 8 may be replaceable with the left plate 4, the right plate 5, or the back plate 7. This adds to the flexibility of the drawing directions of the power cable 22 and the signal cables 32.

Each of the hinges H may support the open-close panel 8 pivotally with respect to the right plate 5 instead of the top plate 6.

The cable guide piece 8d may be omitted from the open-close panel 8.

The first external cable 53 and the second external cable 54 may be arranged in the open-close panel 8.

The power cable 22 and the signal cable 32 may be bundled together to form a single composite cable. The composite cable may be connected to a single composite connector.

The cover case 40, which protects the input terminal 13, may be omitted.

The stopper 15, which maintains the open-close panel 8 in an open state, may be omitted.

The open-close panel 8 may be opened not only for replacement of the motor drivers 11 but also for identifying a fault in the casing 2.

An emergency stop switch or a programmable logic controller may be connected to the controller 1, instead of the personal computer PC and the teaching pendant TP.

The industrial robot RB is not restricted to the horizontally articulated type four-axis control industrial robot but may be an industrial robot controlled in correspondence with a single axis or two or three or five or more axes. The industrial robot RB may be a vertically articulated type six-axis control industrial robot.

Although the multiple embodiments have been described herein, it will be clear to those skilled in the art that the present invention may be embodied in different specific forms without departing from the spirit of the invention. The invention is not to be limited to the details given herein, but may be modified within the scope and equivalence of the appended claims.

The invention claimed is:

1. A robot control device that controls operation of an industrial robot, the robot control device being connected to the industrial robot through a connection cable, an actuator being provided in the industrial robot, wherein the robot control device comprises:
   an actuator controller that controls operation of the actuator;
   a casing that accommodates the actuator controller, the casing having a side surface;
   a connecting portion connected to the connection cable; and
   a stepped portion provided on the side surface in such a manner that the side surface of the casing has at least one of a projection and a recess, wherein the connecting portion is arranged in the stepped portion in such a manner that the connection cable is located on the side surface while extending along the side surface,
   wherein the stepped portion has a stepped surface that extends vertically with respect to the side surface, and
   wherein the connecting portion is formed on the stepped surface,
   wherein the side surface is allowed to be arranged vertically with respect to an installation surface with the casing arranged on the installation surface,
   wherein the connection cable has a vertical portion that extends vertically with respect to the installation surface when the side surface extends vertically with respect to the installation surface, and
   wherein the vertical portion is connected to the connecting portion,
   wherein the stepped portion has a projection projecting from an upper portion of the side surface, a lower surface of the projection having the stepped surface,
   wherein the connecting portion is connected to the connection cable at a position immediately below the stepped surface with the side surface extending vertically with respect to the installation surface, and
   wherein the casing has a support member that supports the side surface pivotally about an upper side of the side surface.

2. The robot control device according to claim 1, further comprising a guide member that is provided in the casing and guides the connection cable extending on the side surface in a desired direction.

3. A robot control device that controls operation of an industrial robot, the robot control device being connected to the industrial robot through a connection cable, an actuator being provided in the industrial robot, wherein the robot control device comprises:

an actuator controller that controls operation of the actuator;

a casing that accommodates the actuator controller, the casing having a side surface;

a connecting portion connected to the connection cable;

a stepped portion provided on the side surface in such a manner that the side surface of the casing has at least one of a projection and a recess, wherein the connecting portion is arranged in the stepped portion in such a manner that the connection cable is located on the side surface while extending along the side surface; and a guide member that is provided in the casing and guides the connection cable extending on the side surface in a desired direction, wherein the casing has a support member that supports the side surface pivotally about an upper side of the side surface, and wherein the guide member guides the connection cable to the upper side of the side surface.

4. The robot control device according to claim 1, wherein the stepped portion is one of a plurality of stepped portions provided on the side surface.

5. The robot control device according to claim 1, wherein the side surface is a front surface of the casing.

6. A robot system comprising:

an industrial robot having an actuator;

a robot control device that controls operation of the industrial robot; and a connection cable that connects the industrial robot to the robot control device:

wherein the robot control device includes:

an actuator controller that controls operation of the actuator;

a casing that accommodates the actuator controller;

a connecting portion connected to the connection cable; and a stepped portion provided on a side surface of the casing in such a manner that the side surface of the casing has at least one of a projection and a recess, wherein the connecting portion is arranged in the stepped portion in such a manner that the connection cable extends along the side surface while arranged on the side surface, wherein the stepped portion has a stepped surface that extends vertically with respect to the side surface, and wherein the connecting portion is formed on the stepped surface, wherein the side surface is allowed to be arranged vertically with respect to an installation surface with the casing arranged on the installation surface, wherein the connection cable has a vertical portion that extends vertically with respect to the installation surface when the side surface extends vertically with respect to the installation surface, and wherein the vertical portion is connected to the connecting portion, wherein the stepped portion has a projection projecting from an upper portion of the side surface, a lower surface of the projection having the stepped surface, wherein the connecting portion is connected to the connection cable at a position immediately below the stepped surface with the side surface extending vertically with respect to the installation surface, and wherein the casing has a support member that supports the side surface pivotally about an upper side of the side surface.

* * * * *